United States Patent
Jo et al.

(10) Patent No.: US 10,141,375 B2
(45) Date of Patent: Nov. 27, 2018

(54) DISPLAY DEVICE HAVING A SOLAR CELL LAYER

(71) Applicant: LG Display Co., Ltd., Seoul (KR)

(72) Inventors: Jang Jo, Seoul (KR); Yeonsuk Kang, Busan (KR); Hye-Jin Gong, Gangwon-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/364,018

(22) Filed: Nov. 29, 2016

(65) Prior Publication Data

US 2017/0154927 A1    Jun. 1, 2017

(30) Foreign Application Priority Data

Nov. 30, 2015    (KR) .................. 10-2015-0169355

(51) Int. Cl.
| | | |
|---|---|---|
| *H01L 27/28* | (2006.01) | |
| *H01L 51/44* | (2006.01) | |
| *H01L 51/52* | (2006.01) | |
| *H01L 27/32* | (2006.01) | |
| *H01L 31/04* | (2014.01) | |
| *H01L 31/0475* | (2014.01) | |

(52) U.S. Cl.
CPC ......... *H01L 27/288* (2013.01); *H01L 51/441* (2013.01); *H01L 51/447* (2013.01); *H01L 51/5246* (2013.01); *H01L 51/5253* (2013.01); *H01L 27/3211* (2013.01); *H01L 27/3244* (2013.01); *H01L 31/0475* (2014.12)

(58) Field of Classification Search
CPC ... H01L 27/288; H01L 51/441; H01L 51/447; H01L 51/5246; H01L 51/5253; H01L 31/0475
See application file for complete search history.

(56) References Cited

U.S. PATENT DOCUMENTS

| | | | | |
|---|---|---|---|---|
| 7,745,252 | B2* | 6/2010 | Suzuki | H01L 51/0021 257/40 |
| 8,946,699 | B2* | 2/2015 | Hatano | G09G 3/3208 257/43 |
| 9,196,866 | B2* | 11/2015 | Schlenker | H01L 51/525 |
| 2010/0181555 | A1* | 7/2010 | Hosokawa | C07D 487/04 257/40 |
| 2010/0245731 | A1 | 9/2010 | Limketkai et al. | |
| 2012/0187394 | A1* | 7/2012 | Hatano | G09G 3/3208 257/43 |

(Continued)

FOREIGN PATENT DOCUMENTS

CN    102540565 A    5/2017

*Primary Examiner* — Ida M Soward
(74) *Attorney, Agent, or Firm* — Seed Intellectual Property Law Group LLP

(57) ABSTRACT

Disclosed is a display device including a solar cell so as to use power produced by a solar energy, and a method for manufacturing the same, wherein the display device includes light-emitting areas provided on a lower substrate, and a solar cell layer provided on an upper substrate confronting the lower substrate, and provided to produce power by absorbing light, wherein the light-emitting areas include first to third light-emitting areas, and the solar cell layer includes first to third organic solar cell layers which are disposed to areas corresponding to the first to third light-emitting areas.

15 Claims, 15 Drawing Sheets

(56) References Cited

U.S. PATENT DOCUMENTS

| | | | |
|---|---|---|---|
| 2014/0116614 A1* | 5/2014 | Fukai | H01L 51/5246 156/272.8 |
| 2014/0125935 A1* | 5/2014 | Nakamura | G02F 1/1339 349/153 |
| 2014/0126188 A1* | 5/2014 | Seo | H01L 31/162 362/183 |
| 2014/0209897 A1* | 7/2014 | Kubota | H01L 29/41733 257/43 |
| 2015/0317015 A1* | 11/2015 | Eguchi | G06F 3/044 345/174 |
| 2015/0318339 A1* | 11/2015 | Nakamura | H01L 51/5234 257/98 |
| 2016/0005873 A1* | 1/2016 | Jintyou | H01L 29/7869 257/43 |
| 2016/0147109 A1* | 5/2016 | Yamazaki | G02F 1/133345 349/42 |
| 2016/0195983 A1* | 7/2016 | Miyake | G06F 3/0416 345/174 |
| 2017/0077428 A1* | 3/2017 | Sakuishi | H01L 51/0097 |
| 2017/0084248 A1* | 3/2017 | Shi | G09G 5/006 |

* cited by examiner

P3

P2

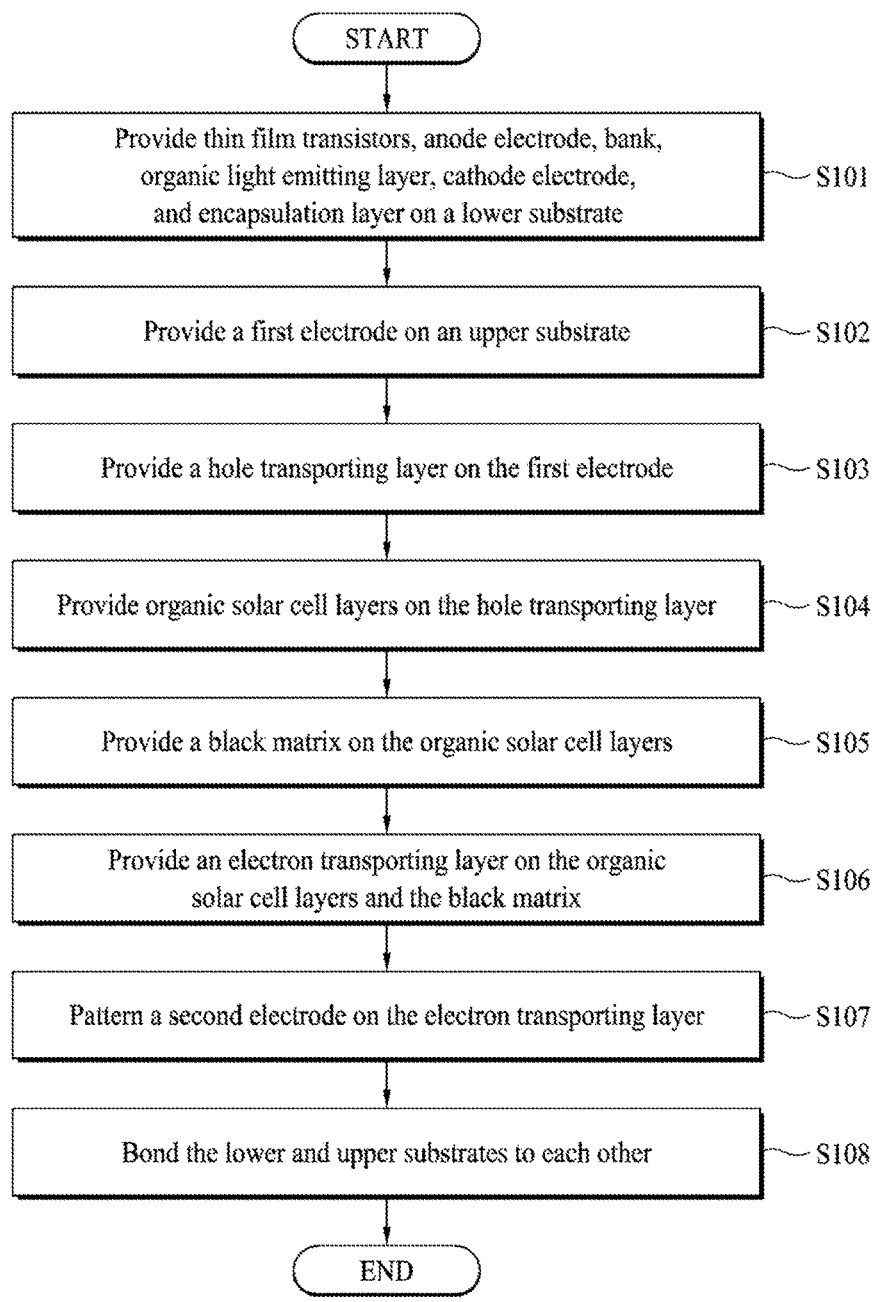

DISPLAY DEVICE HAVING A SOLAR CELL LAYER

CROSS REFERENCE TO RELATED APPLICATIONS

This application claims the benefit of Korean Patent Application No. 10-2015-0169355 filed on Nov. 30, 2015, which is hereby incorporated by reference as if fully set forth herein.

BACKGROUND

Field of the Disclosure

Embodiments of the present disclosure relate to a display device and a method for manufacturing the same.

Discussion of the Related Art

With the advancement of an information-oriented society, various requirements for the display device of displaying an image are increasing. Thus, there are various display devices of liquid crystal display (LCD) devices, plasma display panel (PDP) devices, organic light emitting display (OLED) devices, etc.

Recently, the display device is applied to portable devices such as smart phones, tablets, notebook computers, and the like. Generally, the portable device is used while a user who carries the portable device is moving. Thus, it is difficult to additionally supply external power to the portable device. That is, the portable device uses an internal battery as a power supply source. For this reason, a manufacturer of the portable device has been studied for a method of improving a capacity of the internal battery or minimizing power consumption in the display device so as to use the portable device for long periods of time without additionally supplying external power.

SUMMARY

Accordingly, embodiments of the present disclosure are directed to a display device that substantially reduces one or more problems due to limitations and disadvantages of the related art, and a method for manufacturing the same.

An aspect of embodiments of the present disclosure is directed to provide a display device including a solar cell so as to use power produced by solar energy, and a method for manufacturing the same.

Additional advantages and features of embodiments of the disclosure will be set forth in part in the description which follows and in part will become apparent to those having ordinary skill in the art upon examination of the following or may be learned from practice of embodiments of the disclosure. The objectives and other advantages of embodiments of the disclosure may be realized and attained by the structure particularly pointed out in the written description and claims hereof as well as the appended drawings.

To achieve these and other advantages and in accordance with the purpose of the various embodiments of the present disclosure, as broadly described herein, there is provided a display device that may include light-emitting areas provided on a lower substrate, and a solar cell layer provided on an upper substrate facing the lower substrate, and provided to produce power by absorbing light, wherein the light-emitting areas include first to third light-emitting areas, and the solar cell layer includes first to third organic solar cell layers which are disposed in areas corresponding to the first to third light-emitting areas.

In another aspect of embodiments of the present disclosure, there is provided a method for manufacturing a display device that may include forming light-emitting area for emitting light on a lower substrate, forming a first electrode on an upper substrate facing the lower substrate, forming a hole transporting layer on the first electrode, forming first to third organic solar cell layers on the hole transporting layer, forming a black matrix on the first to third organic solar cell layers, wherein the black matrix is disposed in edges of the first to third organic solar cell layers, providing an electron transporting layer on the first to third organic solar cell layers and the black matrix, and providing a second electrode on the electron transporting layer, wherein the second electrode is disposed to areas corresponding to the first to third organic solar cell layers.

It is to be understood that both the foregoing general description and the following detailed description of embodiments of the present disclosure are exemplary and explanatory and are intended to provide further explanation of the invention as claimed.

BRIEF DESCRIPTION OF THE SEVERAL VIEWS OF THE DRAWINGS

The accompanying drawings, which are included to provide a further understanding of embodiments of the disclosure and are incorporated in and constitute a part of this application, illustrate embodiment(s) of the disclosure and together with the description serve to explain the principle of embodiments of the disclosure. In the drawings:

FIG. 7 is a flow chart illustrating a method for manufacturing a display device according to embodiments of the present disclosure.

DETAILED DESCRIPTION

Figure 1:
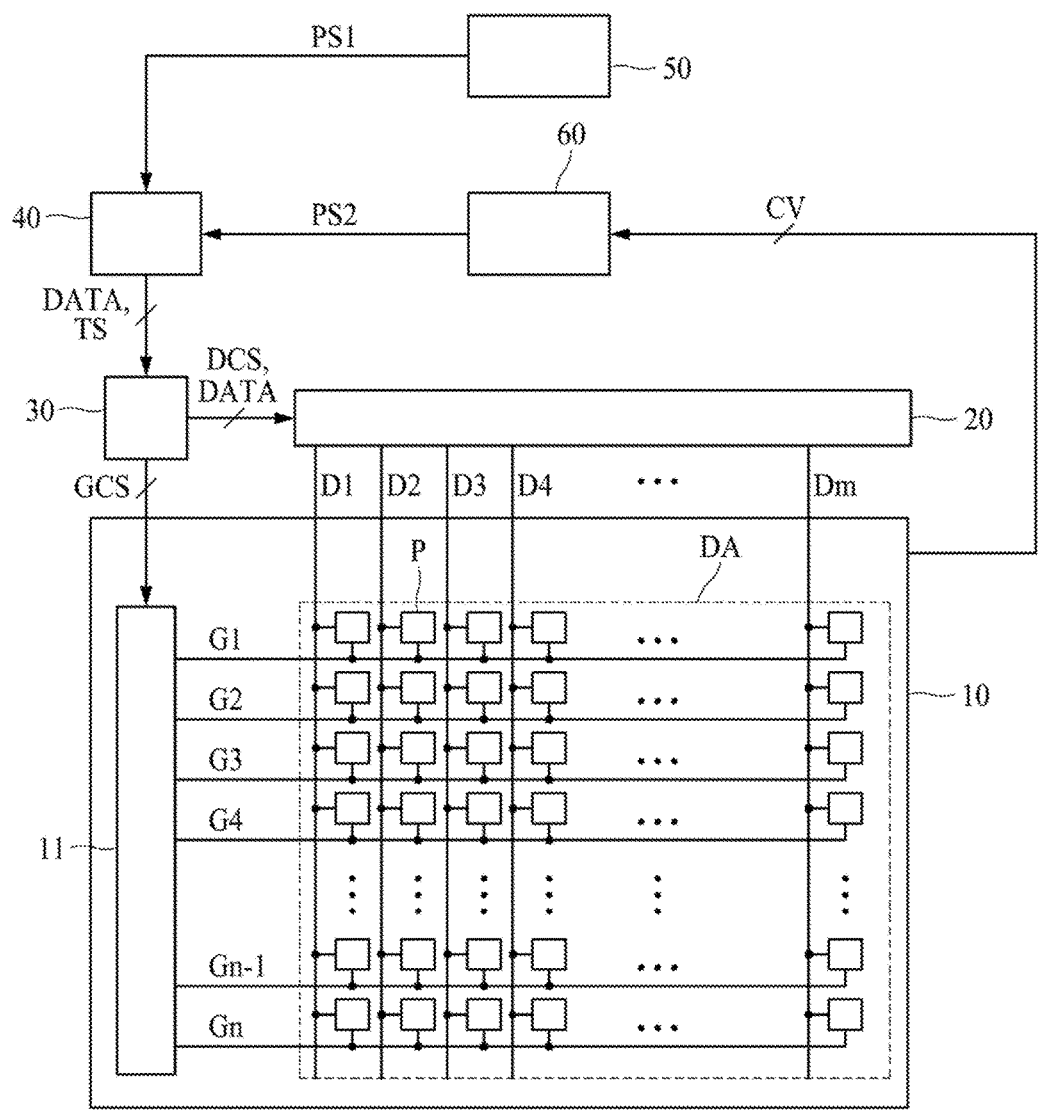
FIG. 1 is a block diagram illustrating a display device according to embodiments of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this disclosure will be thorough and complete, and will convey the scope of the present invention to those skilled in the art. Further, the present invention is only defined by the claims.

A shape, a size, a ratio, an angle, and a number disclosed in the drawings for describing embodiments of the present disclosure are merely exemplary, and thus, the present disclosure is not limited to the illustrated details. Like reference numerals refer to like elements throughout. When a detailed description of a known function or configuration is determined to unnecessarily obscure the description of the various embodiments of the present disclosure, then such detailed description will be omitted, since it is known to those of skill in the art.

In a case where 'comprise', 'have', and 'include' described in the present specification are used, another part may be added unless 'only' is used. The terms of a singular form may include plural forms unless referred to the contrary.

In construing an element, the element is to be construed as including some tolerance for errors, although there is no explicit description.

In describing a position relationship, for example, when the positional order is described as 'on', 'above', 'below', and 'next', a case which is not in contact may be included unless further limiting words are expressly added to exclude such meaning.

In describing a time relationship, for example, when the temporal order is described as 'after', 'subsequent', 'next', and 'before', a case which is not continuous or has intervening steps may be included unless further limiting words are expressly added, such as 'just' or 'direct.'

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

Also, "X-axis direction", "Y-axis direction", and "Z-axis direction" are not limited to a perpendicular geometric configuration. That is, "X-axis direction", "Y-axis direction", and "Z-axis direction may include an applicable wide range of a functional configuration.

Also, it should be understood that the term "at least one" includes all combinations related with any one item. For example, "at least one among a first element, a second element and a third element" may include all combinations of two or more elements selected from the first, second and third elements as well as each element of the first, second and third elements. Also, if it is mentioned that a first element is positioned "on" or "above" a second element, it should be understood that the first and second elements may be brought into contact with each other, or a third element may be interposed between the first and second elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, a display device according to embodiments of the present disclosure and a method for manufacturing the same will be described in detail with reference to the accompanying drawings.

Figure 2:
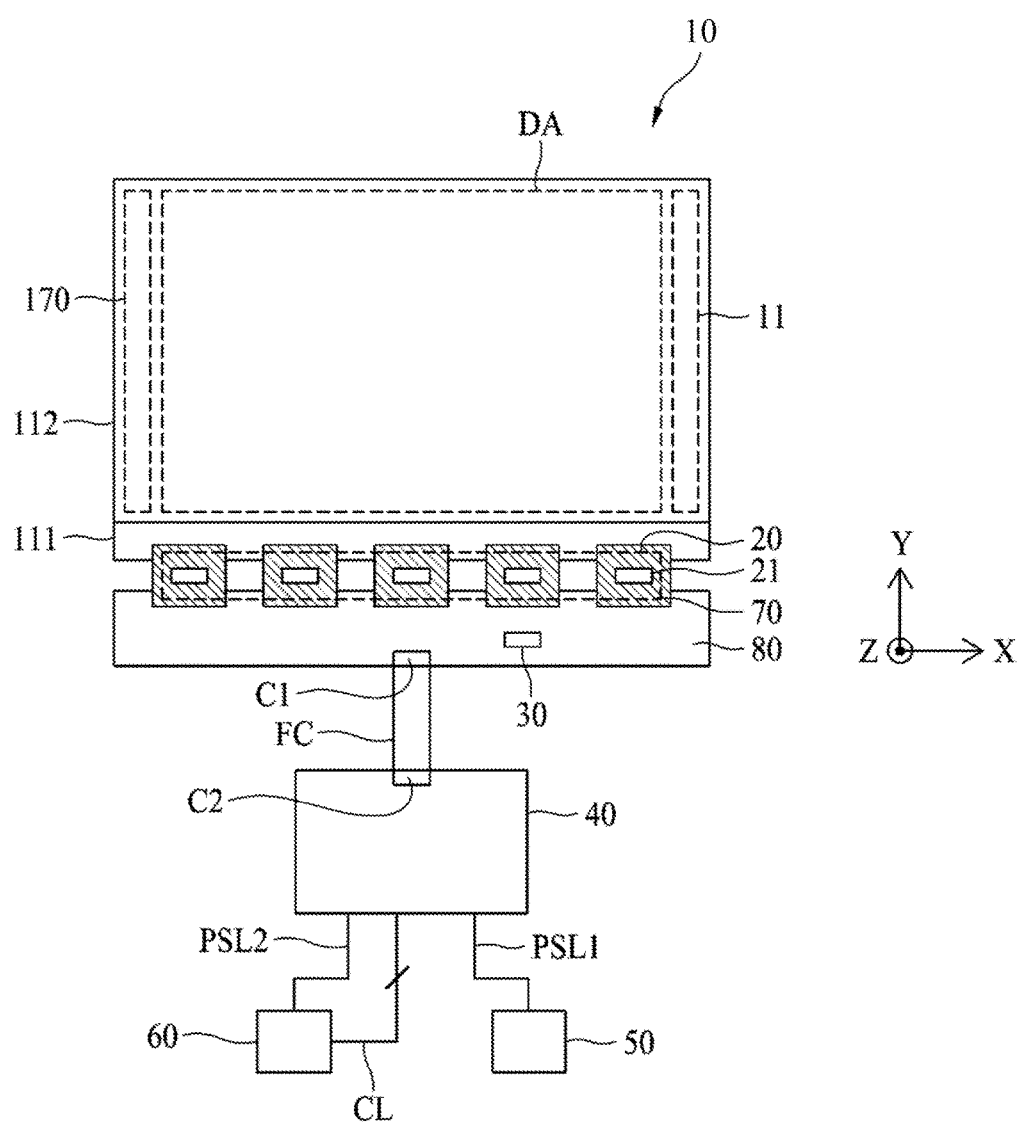
FIG. 2 is an exemplary view illustrating further details of a display device according to embodiments of the present disclosure.

FIG. 1 is an exemplary view illustrating a display device according to embodiments of the present disclosure. FIG. 2 is an exemplary view illustrating a lower substrate, source drive ICs, source flexible films, a circuit board, a timing controller, a system board, a first battery, and a second battery in the display device according to embodiments of the present disclosure.

The display device according to one or more embodiments of the present disclosure may include any display device with line scanning for supplying gate signals to gate lines (G1~Gn), or any display device with line scanning for providing data voltages to pixels. For example, the display device according to embodiments of the present disclosure may be realized in a liquid crystal display device, an organic light emitting display device, a field emission display device, and an electrophoresis display device. Hereinafter, for convenience of explanation, it shows a case wherein the display device according to embodiments of the present disclosure is realized in an organic light emitting display device.

Referring to FIGS. 1 and 2, the display device according to one or more embodiments of the present disclosure may include a display panel 10, a gate driver 11, a data driver 20, a timing controller 30, a system board 40, a first battery 50, and a second battery 60.

The display panel 10 may include a lower substrate 111 and an upper substrate 112. On the lower substrate 111, there is a display area (DA) having data lines (D1~Dm, 'm' is an integer of 2 or more than 2), gate lines (G1~Gn, 'n' is an integer of 2 or more than 2), and light-emitting areas disposed in regions corresponding with intersections of the data lines (D1~Dm) and the gate lines (G1~Gn) (e.g., at pixels P). The display panel 10 is divided into the display area (DA) and a non-display area (NDA). The display area (DA) is an area for displaying an image by the light-emitting areas. The non-display area (NDA) is an area provided in the periphery of the display area (DA), wherein an image is not displayed in the non-display area (NDA). Each of the light-emitting areas includes an organic light emitting device. The light-emitting area will be described in detail with reference to FIG. 3.

A solar cell layer is provided in the upper substrate 112 of the display panel 10, and the solar cell layer converts incident light into electrical power. The solar cell layer may include a plurality of organic solar cell layers. The solar cell layer will be described in detail with reference to FIG. 3.

The gate driver 11 supplies gate signals to the gate lines (G1~Gn). In detail, the gate driver 11 receives a gate control signal (GCS), generates the gate signals in accordance with the gate control signal (GCS), and supplies the generated gate signals to the gate lines (G1~Gn).

The gate driver 11 may be provided in the non-display area (NDA) by a gate driver in panel (GIP) method. In FIG. 1, the gate driver 11 is provided in the non-display area (NDA) outside of one side of the display area (DA), but embodiments provided herein are not limited to this structure. For example, the gate driver 11 may be provided in the non-display area (NDA) outside of both sides of the display area (DA), as shown in FIG. 2.

The gate driver 11 may include a plurality of gate drive integrated circuits (hereinafter, referred to as 'gate drive IC'). The gate drive ICs may be mounted on the gate flexible films. Each of the gate flexible films may be a gate carrier package or a chip on film. The gate flexible films may be attached to the non-display area (NDA) of the display panel 10 by a tape automated bonding (TAB) method using an anisotropic conductive film, whereby the gate drive ICs may be connected with the gate lines (G1~Gn).

The data driver 20 receives digital video data (DATA) and data control signals (DCS) from the timing controller 30, and converts the digital video data (DATA) into analog data voltages in accordance with the data control signal (DCS). The data driver 20 supplies the analog data voltages to the data lines (D1~Dm). The data driver 20 may include at least one source drive IC 21.

Each of the source drive ICs 21 may be manufactured in a driving chip. Each of the source drive ICs 21 may be mounted on a source flexible film 70. Each source flexible film 70 may be realized in a tape carrier package or a chip on film, and each source flexible film 70 may be bent or curved. Each source flexible film 70 may be attached to the non-display area (NDA) of the display panel 10 by a tape automated bonding (TAB) method using an anisotropic conductive film, whereby the source drive ICs 21 may be connected with the data lines (D1~Dm).

Each of the source drive ICs 21 may be directly attached to the lower substrate 111 by chip on glass (COG) method or chip on plastic (COP) method, and may be connected with the data lines (D1~Dm).

The source flexible films 70 may also be attached to one or more circuit boards 80. The circuit boards 80 may be flexible printed circuit boards capable of being bent or curved. In this case, one circuit board 80 or a plurality of circuit boards 80 may be provided.

The timing controller 30 receives video data (DATA) and timing signals (TS) from the system board 40. The timing signals may include a vertical synchronization signal, a horizontal synchronization signal, a data enable signal, a dot clock, and etc.

The timing controller 30 generates the gate control signal (GCS) for controlling an operation timing of the gate driver 11, and generates the data control signal (DCS) for controlling an operation timing of the data driver 20 on the basis of driving timing information stored in a memory such as an electrically erasable programmable read-only memory (EEPROM). The timing controller 30 supplies the gate control signal (GCS) to the gate driver 11. The timing controller 30 supplies the video data (DATA) and data control signal (DCS) to the data driver 20.

The timing controller 30 may be mounted on the circuit board 80, as shown in FIG. 2. The circuit board 80 may be connected with the system board 40 through a flexible cable (FC) such as flexible flat cable (FFC) or flexible printed circuit (FPC). The flexible cable (FC) connects a connector (C1) provided in the circuit board 80 with a second connector (C2) provided in the system board 40.

The system board 40 may include an application processor (AP) or a graphic processing unit (GPU) for supplying the video data (DATA) and timing signals (TS) to the timing controller 30. The graphic processing unit (GPU) or application processor (AP) converts the externally-provided video data (DATA) into a type appropriate for the display panel 10, and outputs the converted type appropriate for the display panel 10.

The first battery 50 serves as a first power supply for supplying a first power voltage to the system board 40 via a first power supply line (PSL1). The second battery 60 serves as a second power supply for supplying a second power voltage to the system board 40 via a second power supply line (PSL2) when the first battery 50 is discharged.

The second battery 60 receives a charging current (CV) from the solar cell layer of the display panel 10. The second battery 60 may be charged with the charging current (CV) of the solar cell layer. For example, an anode of the second battery 60 is connected with a first electrode for collecting holes of the solar cell layer, and a cathode of the second battery 60 is connected with a second electrode for collecting electrons of the solar cell layer, whereby the second battery 60 is charged.

Meanwhile, it is possible to omit the second battery 60. In this case, the first battery 50 may be supplied with the charging current (CV) from the solar cell layer of the display panel 10. The charging current (CV) may be supplied from the display panel 10 to the second battery 60 through the source flexible film 70, the circuit board 80, the flexible cable (FC), the system board 40, and charging line (CL).

As described above, the display device according to the embodiment of the present disclosure includes the solar cell layer for converting incident light into power, whereby the second battery 60 is charged with the charging current (CV) from the solar cell layer. As a result, if the first battery 50 is discharged, the second battery 60 is used as an auxiliary power source. Hereinafter, the display device according to the embodiment of the present disclosure will be described in detail with reference to FIG. 3.

Figure 3:
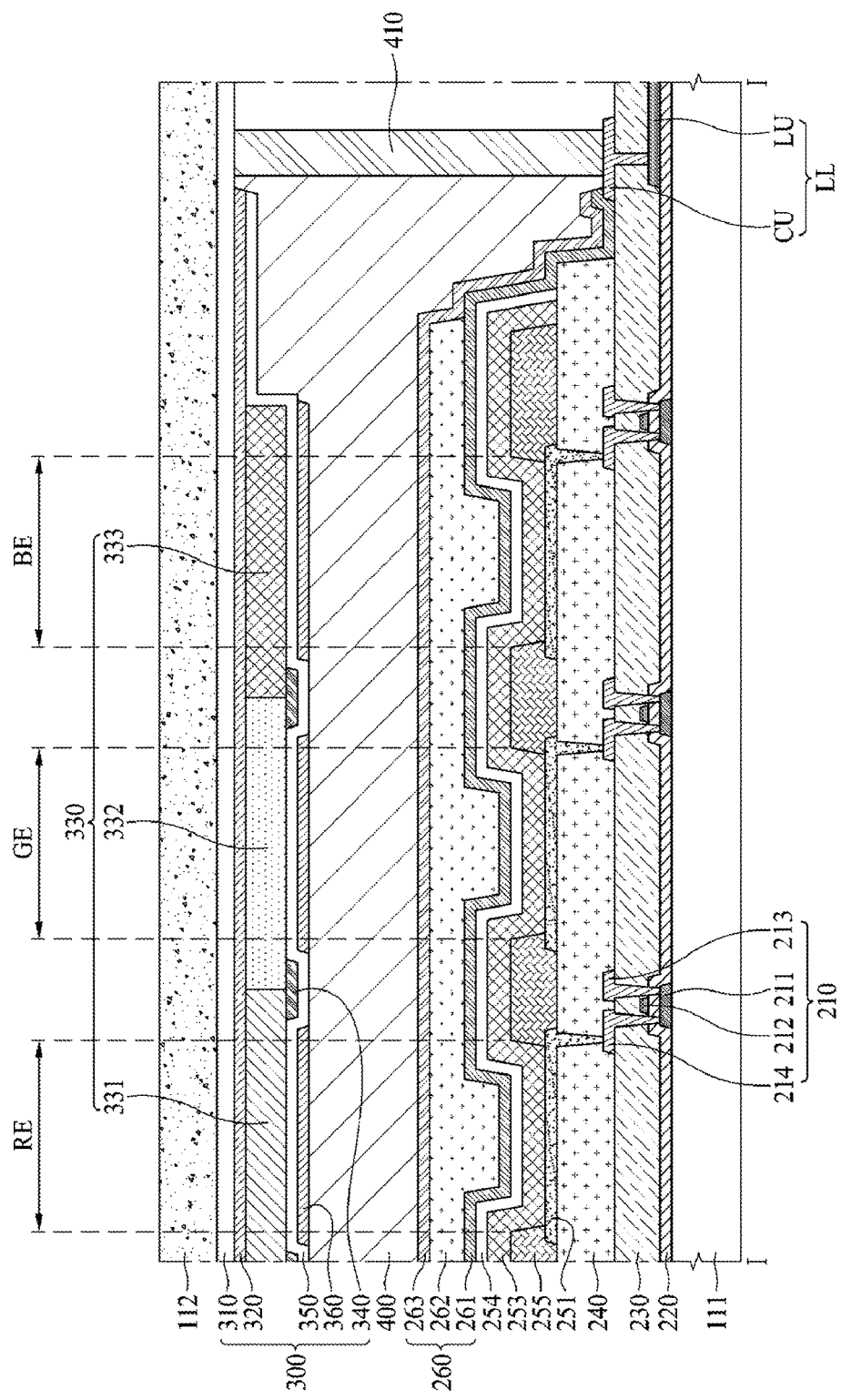
FIG. 3 is a cross sectional view illustrating detailed parts of display device according to embodiments of the present disclosure.

FIG. 3 is a cross sectional view illustrating detailed parts of the display device according to the embodiment of the present disclosure.

Referring to FIG. 3, thin film transistors 210 are provided on the lower substrate 111. Each of the thin film transistors 210 may include a semiconductor layer 211, a gate electrode 212, a source electrode 213, and a drain electrode 214. In FIG. 3, the thin film transistors 210 are formed in a top gate method wherein the gate electrode 212 is positioned above the semiconductor layer 211, but embodiments provided herein are not limited to this method. For example, the thin film transistors 210 may be formed in a bottom gate method wherein the gate electrode 212 is positioned below the semiconductor layer 211, or a double gate method wherein the gate electrode 212 is positioned both above and below the semiconductor layer 211.

On the lower substrate 111, there are the semiconductor layers 211. A buffer film (not shown) may be provided between the lower substrate 111 and the semiconductor layers 211. Also, an insulating interlayer 220 may be provided on the semiconductor layers 211, the gate electrodes 212 may be provided on the insulating interlayer 220, and a gate insulating film 230 may be provided on the gate electrodes 212. Then, the source and drain electrodes 213 and 214 may be provided on the gate insulating film 230. Each of the source and drain electrodes 213 and 214 may be connected with the semiconductor layer 211 via a contact hole penetrating through the insulating interlayer 220 and the gate insulating film 230.

A planarization film 240 may be provided on the source and drain electrodes 213 and 214. The planarization film 240 is provided to maintain flatness in pixels divided by banks 255. The planarization film 240 may be formed of resin such as photo acryl or polyimide.

Then, organic light emitting devices are provided on the planarization film 240. Each of the organic light emitting devices may include an anode electrode 251, an organic light emitting layer 253, and a cathode electrode 254. The organic light emitting devices are divided by the bank 255.

The anode electrodes 251 are provided on the planarization film 240. Each of the anode electrodes 251 is connected with the drain electrode 214 via a contact hole penetrating through the planarization film 240.

The bank 255 is provided to divide the anode electrodes 251. The bank 255 covers each edge of the anode electrodes 251.

The organic light emitting layer 253 is provided on the anode electrodes 251 and the banks 255. Each organic light emitting layer 253 may include a hole transporting layer, a light emitting layer, and an electron transporting layer. In this case, if a voltage is applied to the anode electrode 251 and the cathode electrode 254, the hole and electron are transferred to the light emitting layer through the hole transporting layer and the electron transporting layer, and are combined in the light emitting layer, to thereby emit light.

The organic light emitting layer 253 may include only white light emitting layer for emitting white light. In this case, the white light emitting layer may be provided on an entire surface of the display area (DA). The organic light emitting layer 253 may include a red light emitting layer for emitting red light, a green light emitting layer for emitting green light, and a blue light emitting layer for emitting blue light. In this case, the red light emitting layer is formed only in red light-emitting areas (RE), the green light emitting layer is formed only in green light-emitting areas (GE), and the blue light emitting layer is formed only in blue light-emitting areas (BE). The red light-emitting areas (RE) may refer to first light-emitting areas, the green light-emitting areas (GE) may refer to second light-emitting areas, and the blue light-emitting areas may refer to third light-emitting areas.

The cathode electrode 254 is provided on the organic light emitting layers 253 and the banks 255, to thereby cover the organic light emitting layers 253 and the banks 255.

The organic light emitting display device may be formed in the top emission method. In case of the top emission method, light emitted from the organic light emitting layer 253 advances toward the upper substrate 112, whereby the thin film transistors 210 are largely provided under the bank 255 and the anode electrode 251. That is, a design area of the transistor 210 in the top emission method is relatively larger than a design area of the transistor in the bottom emission method. In case of the top emission method, the anode electrode 251 is formed of a metal material with high reflectance, for example, aluminum (Al) or deposition structure of aluminum (Al) and indium-tin-oxide (ITO) so as to obtain a micro-cavity effect, preferably. Also, in case of the top emission method, since the light of the organic light emitting layer 253 advances toward the upper substrate 112, the cathode electrode 150 may be formed of a transparent metal material capable of transmitting light therethrough, for example, indium-tin-oxide (ITO) or indium-zinc-oxide (IZO), or may be formed of a semi-transparent metal material, for example, magnesium (Mg), silver (Ag), or alloy of magnesium (Mg) and silver (Ag).

An encapsulation layer 260 is provided on the cathode electrode 254. The encapsulation layer 260 prevents oxygen or moisture from being permeated into the organic light emitting layer 253. To this end, the encapsulation layer 260 may include a first inorganic film 261, an organic film 262, and a second inorganic film 263.

The first inorganic film 261 is provided on the cathode electrode 254, to thereby cover the cathode electrode 254. The organic film 262 is provided on the first inorganic film 261, to thereby prevent particles from being permeated into the organic light emitting layer 253 and the cathode electrode 254 through the first inorganic film 261. The second inorganic film 263 is provided on the organic film 262, to thereby cover the organic film 262.

Each of the first and second inorganic films 261 and 263 may be formed of silicon nitride, aluminum nitride, zirconium nitride, titanium nitride, hafnium nitride, tantalum nitride, silicon oxide, aluminum oxide, or titanium oxide. For example, each of the first and second inorganic films 261 and 263 may be formed of SiO2, Al2O3, SiON, or SiNx. The organic film 262 is formed of a transparent material so that the light emitted from the organic light emitting layer 253 passes through the organic film 262.

The solar cell layer 300 is provided on the upper substrate 112. The solar cell layer 300 may include a first electrode 310, a hole transporting layer 320, an organic solar cell layer 330 having first to third organic solar cell layers 331, 332 and 333, an electron transporting layer 350, a black matrix 340, and a second electrode 360.

The first electrode 310 is provided on the upper substrate 112 facing the lower substrate 111. The first electrode 310 may be formed of a transparent metal material such as ITO or IZO enabling a light transmission, or may be formed of a semi-transparent metal material such as magnesium (Mg), silver (Ag), or an alloy of magnesium (Mg) and silver (Ag). The first electrode 310 may be provided on an entire surface of the display area (DA).

The hole transporting layer 320 may be provided on the first electrode 310. The hole transporting layer 320 enables a smooth transmission of the hole from the first to third organic solar cell layers 331, 332 and 333 to the first electrode 310. In one or more embodiments, the hole transporting layer 320 may be formed of TPD(N,N'-diphenyl-N, N'-bis(3-methylphenyl)-1,1'-bi-phenyl-4,4'-diamine), or NPB(N,N'-di(naphthalen-1-yl)-N,N'-diphenyl-benzidine), but is not limited to these materials. The hole transporting layer 320 may be provided on an entire surface of the display area (DA).

The first to third organic solar cell layers 331, 332 and 333 are provided on the hole transporting layer 320. The first organic solar cell layer 331 is disposed in the red light-emitting areas (RE), the second organic solar cell layer 332 is disposed in the green light-emitting areas (GE), and the third organic solar cell layer 333 is disposed in the blue light-emitting areas (BE).

Each of the first to third organic solar cell layers 331, 332 and 333 may be formed in a bi-layer or blended layer structure of donor and acceptor materials. Each of the first to third organic solar cell layers 331, 332 and 333 may be formed in a structure of disposing the blended layer between the donor material layer and the acceptor material layer. The donor material supplies the electron, and the acceptor material receives the electron. In order to improve photoelectric efficiency in each of the first to third organic solar cell layers 331, 332 and 333, the donor material has high light absorbing efficiency and high charge mobility, and the acceptor material has relatively-high electron affinity and relatively-high charge mobility in comparison to the donor material.

The donor material for each of the first to third organic solar cell layers 331, 332 and 333 may be formed of poly(para-phenylene vinylene)(PPV)-based material, derivates of polythiophene(PT), polyfluorene(PF)-based material or their copolymers, or soluble polythiophene(P3HT) of crystalline polymer.

Figure 4A:
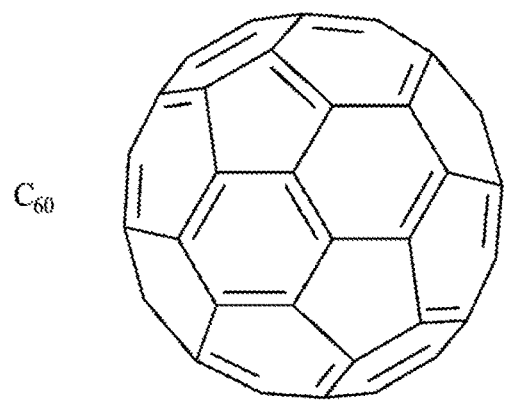
FIGS. 4A and 4B are exemplary views illustrating acceptors included in first to third organic solar cell layers according to embodiments of the present disclosure.
Figure 4B:
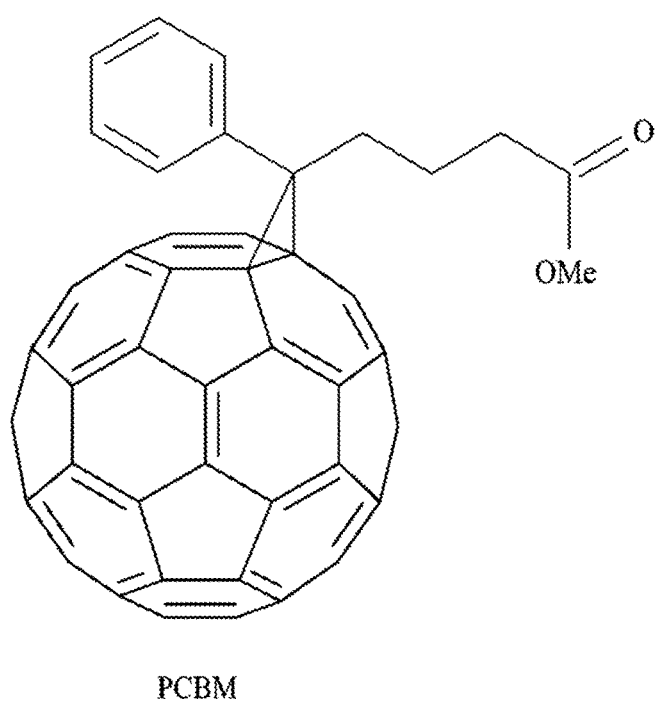

The acceptor material for each of the first to third organic solar cell layers 331, 332 and 333 may be formed of C60 as shown in FIG. 4A, or C60 derivates (fullerene derivates) designed to dissolve C60 in an organic solvent as shown in FIG. 4B. In this case, C60 derivates may be PCBM. If the first to third organic solar cell layers 331, 332 and 333 are formed by a deposition process, the acceptor material is formed of C60. Meanwhile, if the first to third organic solar cell layers 331, 332 and 333 are formed of a solution process, the acceptor material is formed of PCBM.

In each of the first to third organic solar cell layers 331, 332 and 333, the hole and electron produced by absorption of solar ray may be drifted, the hole may be collected in the first electrode 310 through the hole transporting layer 320, and the electron may be collected in the second electrode 360 through the electron transporting layer 350. The first electrode 310 is connected with the anode of the second battery 60, and the second electrode 320 is connected with the cathode of the second battery 60, whereby the second battery 60 is charged by the first to third organic solar cell layers 331, 332 and 333.

Each of the first to third organic solar cell layers 331, 332 and 333 absorbs light with predetermined wavelengths of visible rays, whereby each of the first to third organic solar cell layers 331, 332 and 333 serves as a color filter. To this end, the respective first to third organic solar cell layers 331, 332 and 333 may have the different light-absorbing wavelength ranges and light-transmitting wavelength ranges.

The donor material of the first organic solar cell layer 331 may have the wavelength range of absorbing light except red light, that is, the donor material of the first organic solar cell layer 331 may have the wavelength range of transmitting red light. In this case, the first organic solar cell layer 331 may function as a red color filter. Also, the donor material of the second organic solar cell layer 332 may have the wavelength range of absorbing light except green light, that is, the donor material of the second organic solar cell layer 332 may have the wavelength range of transmitting green light. In this case, the second organic solar cell layer 332 may function as a green color filter. Also, the donor material of the third organic solar cell layer 333 may have the wavelength range of absorbing light except blue light, that is, the donor material of the third organic solar cell layer 333 may have the wavelength range of transmitting blue light. In this case, the third organic solar cell layer 333 may function as a blue color filter.

Figure 5A:
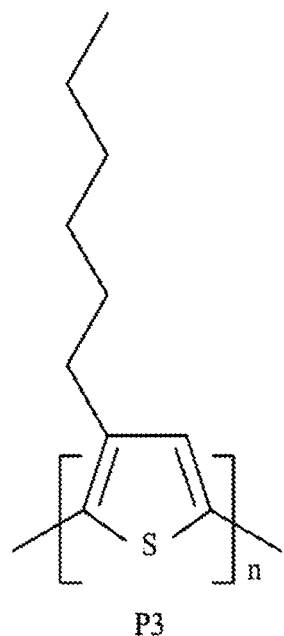
FIGS. 5A and 5B are exemplary views illustrating donors included in first to third organic solar cell layers according to embodiments of the present disclosure.
Figure 5B:
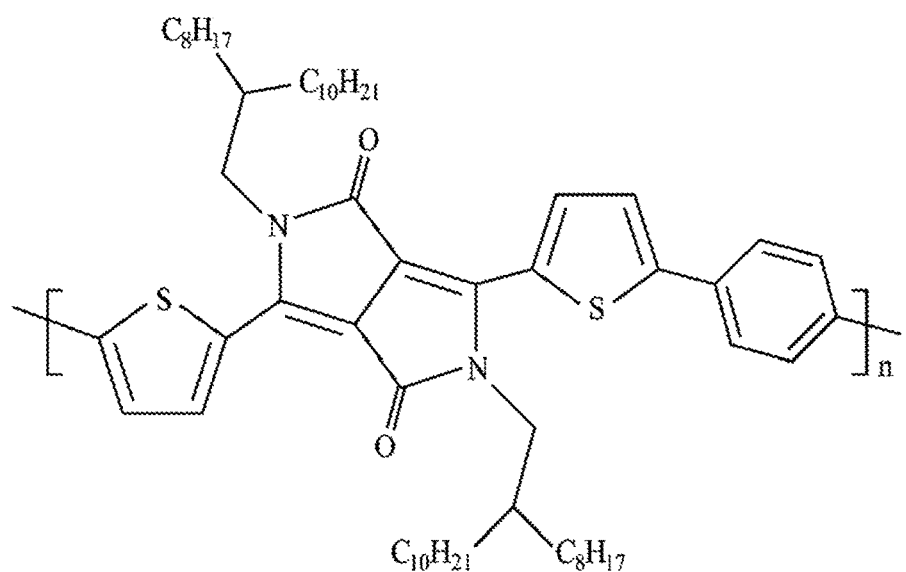

For example, the donor material of the first organic solar cell layer 331 may include P3HT as shown in FIG. 5A. The donor material of the second organic solar cell layer 332 may include JR4-193. The donor material of the third organic solar cell layer 333 may include P2 as shown in FIG. 5C.

Figure 6:
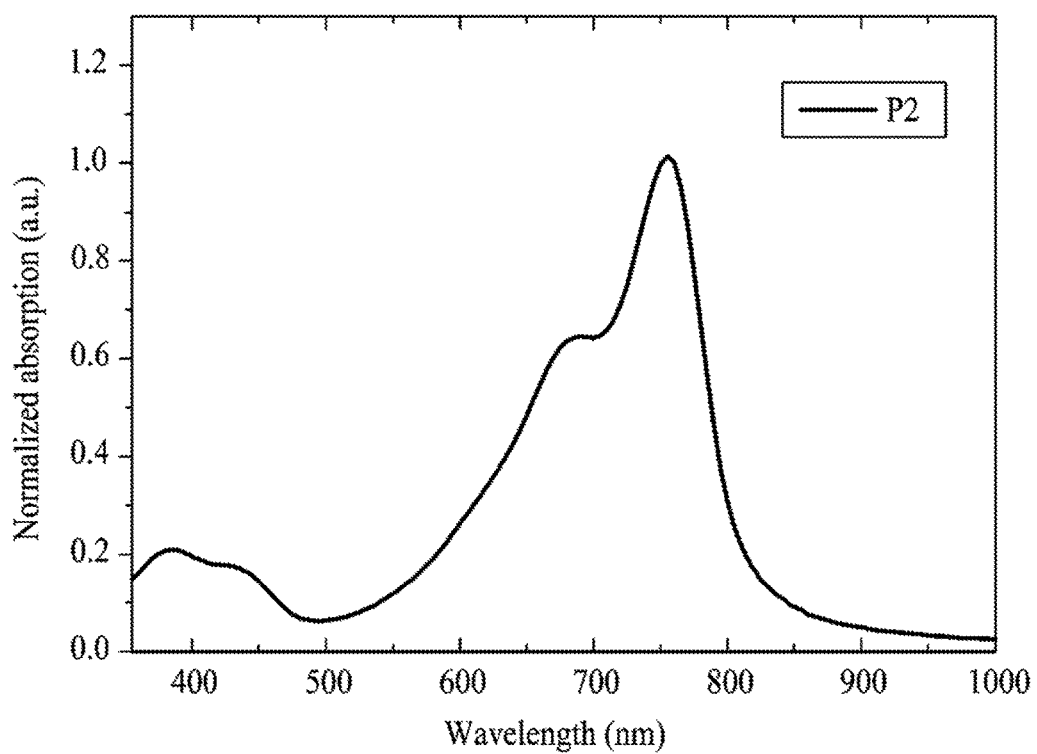
FIG. 6 is a graph showing a light-absorbing wavelength range of a donor material including P2, as shown in FIG. 5B.

If the third organic solar cell layer 333 includes the acceptor material of PCBM, and the donor material of P2, the light-absorbing wavelength range is within a range from 600 nm to 800 nm, as shown in FIG. 6. Accordingly, the third organic solar cell layer 333 absorbs the light having the wavelength of 600 nm to 800 nm, and transmits the light having the wavelength of 400 nm to 600 nm. Thus, the third organic solar cell layer 333 transmits the light having the wavelength of 400 nm to 600 nm, whereby the third organic solar cell layer 333 functions as a blue color filter or cyan color filter.

The black matrix 340 is provided on the first to third organic solar cell layers 331, 332 and 333, and the black matrix 340 is overlapped with the bank 255. In this case, the black matrix 340 may be provided in edges of the first to third organic solar cell layers 331, 332 and 333. The black matrix 340 includes a material capable of absorbing the light. The black matrix 340 prevents the light emitted from the neighboring light-emitting areas from being mixed together.

The electron transporting layer 350 may be provided on the first to third organic solar cell layers 331, 332 and 333 and the black matrix 340. The electron transporting layer 350 is provided for a smooth transmission of the electron from the first to third organic solar cell layers 331, 332 and 333 to the second electrode 360. In one or more embodiments, the electron transporting layer 350 may be formed of PBD(2-(4-biphenyl)-5-(4-tert-butylphenyl)-1,3,4-oxadiazole), TAZ(3-(4-biphenyl)-4-phenyl-5-tertbutylphenyl-1,2,4-triazole), Liq(8-hydroxyquinolinolato-lithium), BAlq(Bis (2-methyl-8-quinolinolate)-4-(phenylphenolato) aluminium), TPBi(2,2',2'-(1,3,5-benzinetriyl)-tris(1-phenyl-1-H-benzimidazole), and etc., but is not limited to these materials. The electron transporting layer 350 may be provided on an entire surface of the display area (DA).

The second electrode 360 is provided on the electron transporting layer 350, and the second electrode 360 is disposed corresponding to the first to third organic solar cell layers 331, 332 and 333. In this case, the second electrode 360 may be overlapped with the first to third light-emitting areas (RE, GE, BE). The second electrode 360 may be formed of a transparent metal material enabling a light transmission, for example, indium-tin-oxide (ITO) or indium-zinc-oxide (IZO), or may be formed of a semi-transparent metal material, for example, magnesium (Mg), silver (Ag), or alloy of magnesium (Mg) and silver (Ag).

The first electrode 310 may be connected with a link line (LL) provided in the lower substrate 111 through a conductive adhesive member 410. The conductive adhesive member 410 may be an anisotropic conductive film or anisotropic conductive paste. The link line (LL) may include a connection unit (CU) which is provided in the same layer as the source and drain electrodes 213 and 214 and is formed of the same material as those of the source and drain electrodes 213 and 214, and is electrically connected with the first electrode 310 through the conductive adhesive member 410, and a link unit (LU) which is provided in the same layer as the gate electrode 212, and is formed of the same material as that of the gate electrode 212. The connection unit (CU) is connected with the link unit (LU) via a contact hole penetrating through the gate insulating film 230. The link unit (LU) is connected with a pad. Accordingly, the first electrode 310 may be connected with the second battery 60 through the conductive adhesive member 410, the link line (LL), and the pad.

Meanwhile, for convenience of explanation, FIG. 3 shows that only the first electrode 310 is connected with the link line (LL) of the lower substrate 111 through the conductive adhesive member 410. In the same manner as the first electrode 310, the second electrode 360 may be also connected with another link line of the lower substrate 111 through the conductive adhesive member 410.

The lower substrate 111 and the upper substrate 112 are bonded to each other by the use of transparent adhesive layer 400. The transparent adhesive layer 400 may be transparent adhesive resin. In detail, the transparent adhesive layer 400 adheres the second inorganic film 263 of the lower substrate 111 with the second electrode 360 and the electron transporting layer 350 of the upper substrate 112, to thereby bond the lower substrate 111 and the upper substrate 112 to each other.

As described above, the first electrode 310, the first to third organic solar cell layers 331, 332 and 333, and the second electrode 360 are provided on the upper substrate 112 of the display device according to the embodiment of the present disclosure. As a result, the hole and electron produced by absorption of solar rays in the first to third organic solar cell layers 331, 332 and 333 may be provided to the first electrode 310 and the second electrode 360, whereby the second battery 60 may be charged. Accordingly, the power produced by the solar energy may be used as the auxiliary power.

Also, the external light may be absorbed in the first to third organic solar cell layers 331, 332 and 333. As a result, it is possible to prevent visibility from being lowered by the reflection of external light in the top emission method. Also, there is no need to attach a polarizing plate, which is provided to reduce the reflection of external light, to the upper substrate 112.

Also, the first to third organic solar cell layers 331, 332 and 333 are disposed in areas corresponding to the first to third light-emitting areas (RE, GE, BE), and the respective first to third organic solar cell layers 331, 332 and 333 have different light-absorbing wavelength ranges and light-transmitting wavelength ranges. As a result, the first to third organic solar cell layers 331, 332 and 333 serve as the color filters.

FIG. 7 is a flow chart illustrating a method for manufacturing the display device according to embodiments of the present disclosure. FIGS. 8A to 8H are cross sectional views illustrating a method for manufacturing the display device according to embodiments of the present disclosure. Hereinafter, a method for manufacturing a display device according to one or more embodiments of the present disclosure will be described in detail with reference to FIG. 7 and FIGS. 8A to 8H.

Figure 8A:
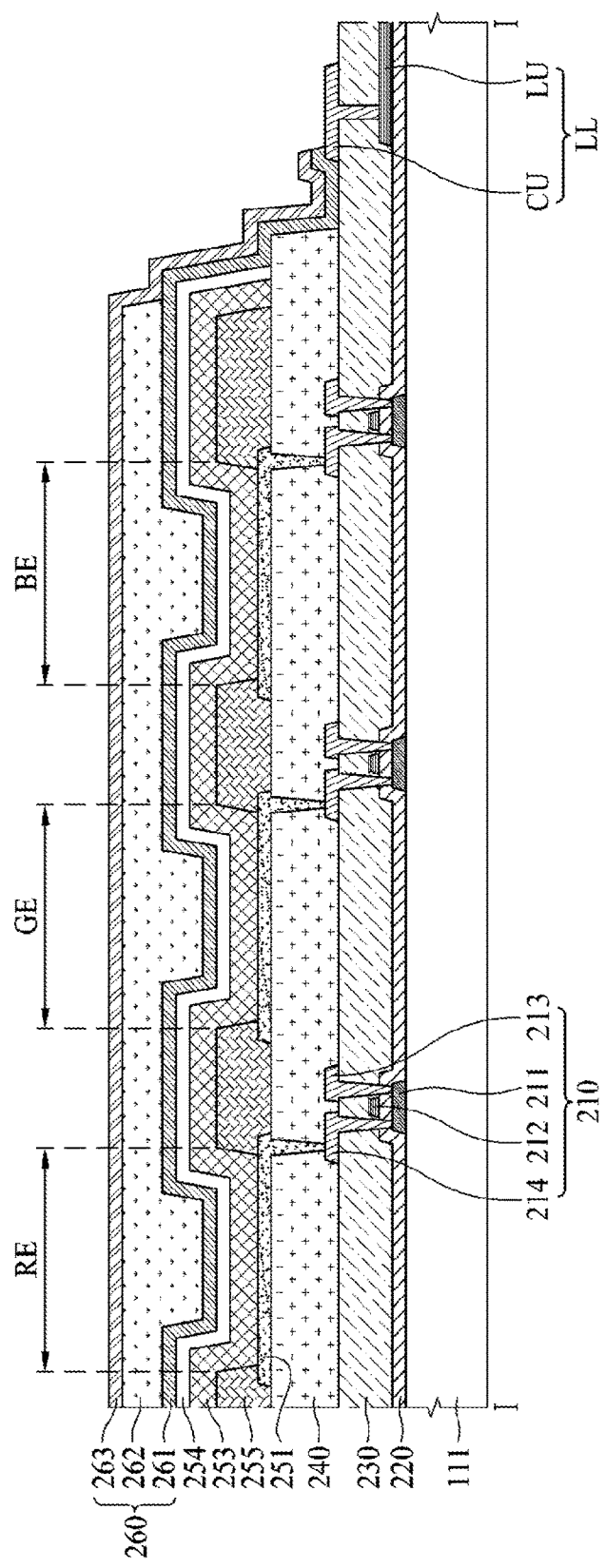
FIGS. 8A to 8H are cross sectional views illustrating a method for manufacturing a display device according to embodiments of the present disclosure.

Firstly, as shown in FIG. 8A, the gate lines, the data lines, the thin film transistors 210, the anode electrodes 221, the bank 255, the organic light emitting layer 253, the cathode electrode 254, and the encapsulation layer 260 are provided on the lower substrate 111.

The lower substrate 111 may be formed of glass or plastic. FIG. 8A shows that the thin film transistors 210 are formed in the top gate method wherein the gate electrode is positioned above the semiconductor layer, but embodiments provided herein are not limited to this method. For example, the thin film transistors 210 may be formed in the bottom gate method wherein the gate electrode is positioned below the semiconductor layer. The thin film transistors 210 are provided in the display area (DA).

The semiconductor layers 211 are provided on the lower substrate 111. After forming a buffer film (not shown) on the lower substrate 111, the semiconductor layers 211 may be formed on the buffer film (not shown). The insulating interlayer 220 is provided on the semiconductor layers 211, wherein the insulating interlayer 220 is provided to insulate the semiconductor layers 211 from the other metal materials. The gate electrodes 212 are provided on the insulating interlayer 220. The gate insulating film 230 is provided on the gate electrodes 212. The source and drain electrodes 213 and 214 are provided on the gate insulating film 230. Before forming the source and drain electrodes 213 and 214, the contact holes penetrating through the insulating interlayer 220 and the gate insulating film 230 may be formed to expose the semiconductor layers 211. Accordingly, each of the source and drain electrodes 213 and 214 may be connected with the semiconductor layer 211 via the contact hole penetrating through the insulating interlayer 220 and the gate insulating film 230.

The planarization film 240 is provided on the source and drain electrodes 213 and 214. The planarization film 240 is provided to maintain flatness in the pixels divided by the banks 255. The planarization film 240 may be formed of resin such as photo acryl or polyimide.

The anode electrodes 251 are provided on the planarization layer 240. Before forming the anode electrodes 251, the contact holes for exposing the drain electrodes 214 through the planarization layer 240 may be formed, whereby each of the anode electrodes 251 may be connected with the drain electrode 214 via the contact hole penetrating through the planarization layer 240. In case of the top emission method, the anode electrode 251 may be formed of the metal material with high reflectance, for example, aluminum (Al) or deposition structure of aluminum (Al) and indium-tin-oxide (ITO) so as to obtain a micro-cavity effect, preferably.

The bank 255 is provided to divide the anode electrodes 251. The bank 255 covers each edge of the anode electrodes 251.

The organic light emitting layer 253 is provided on the anode electrodes 251 and the banks 255. Each organic light emitting layer 253 may include the hole transporting layer, the light emitting layer, and the electron transporting layer. The organic light emitting layer 253 may include only white light emitting layer for emitting white light. In this case, the white light emitting layer may be provided on the entire surface of the display area (DA). The organic light emitting layer 253 may include the red light emitting layer for emitting red light, the green light emitting layer for emitting green light, and the blue light emitting layer for emitting blue light. In this case, the red light emitting layer is formed only in red light-emitting areas (RE), the green light emitting layer is formed only in green light-emitting areas (GE), and the blue light emitting layer is formed only in blue light-emitting areas (BE).

The cathode electrode 254 is provided on the organic light emitting layers 253 and the banks 255, to thereby cover the organic light emitting layers 253 and the banks 255. In case of the top emission method, the cathode electrode 254 may be formed of a transparent metal material, for example, indium-tin-oxide (ITO) or indium-zinc-oxide (IZO), or may be formed of a semi-transparent metal material, for example, magnesium (Mg), silver (Ag), or alloy of magnesium (Mg) and silver (Ag).

The encapsulation layer 260 including the plurality of inorganic films and at least one organic film is provided on the cathode electrode 254. The first inorganic film 261 may be provided on the cathode electrode 254, the organic film 262 is provided on the first inorganic film 261, and the second inorganic film 263 is provided on the organic film 262. The first and second inorganic films 261 and 263 may be formed of silicon nitride, aluminum nitride, zirconium nitride, titanium nitride, hafnium nitride, tantalum nitride, silicon oxide, aluminum oxide, or titanium oxide. For example, each of the first and second inorganic films 261 and 263 may be formed of SiO2, Al2O3, SiON, or SiNx. The organic film 262 is formed of a transparent material so that the light emitted from the organic light emitting layer 253 passes through the organic film 262. (S101 of FIG. 7)

Figure 8B:
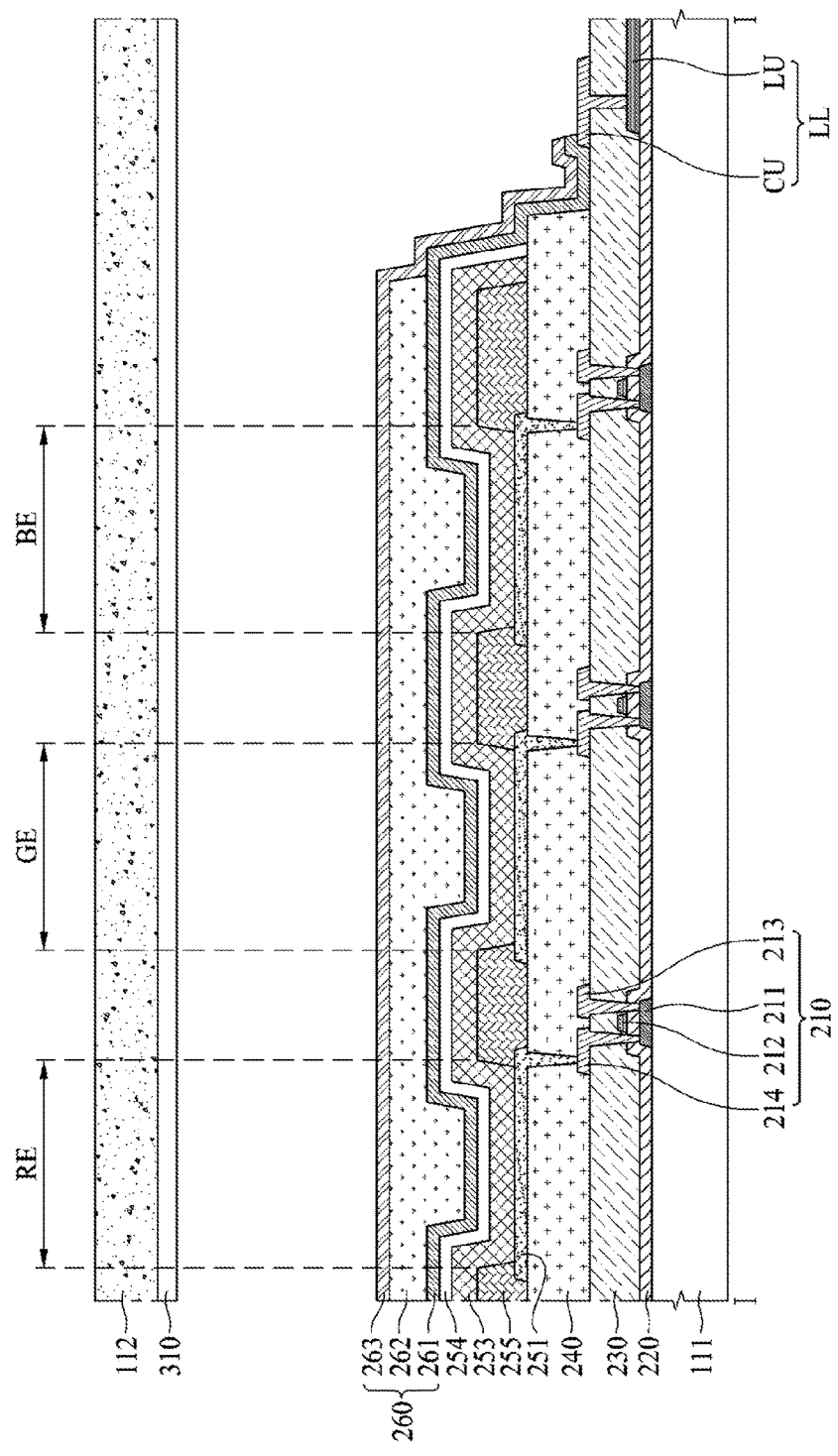

Secondly, as shown in FIG. 8B, the first electrode 310 is provided on the upper substrate 112 facing the lower substrate 111.

The first electrode 310 may be formed of a transparent metal material such as ITO or IZO enabling a light transmission, or may be formed of a semi-transparent metal material such as magnesium (Mg), silver (Ag), or an alloy of magnesium (Mg) and silver (Ag). The first electrode 310 may be provided on an entire surface of the display area (DA). (S102 of FIG. 7)

Figure 8C:
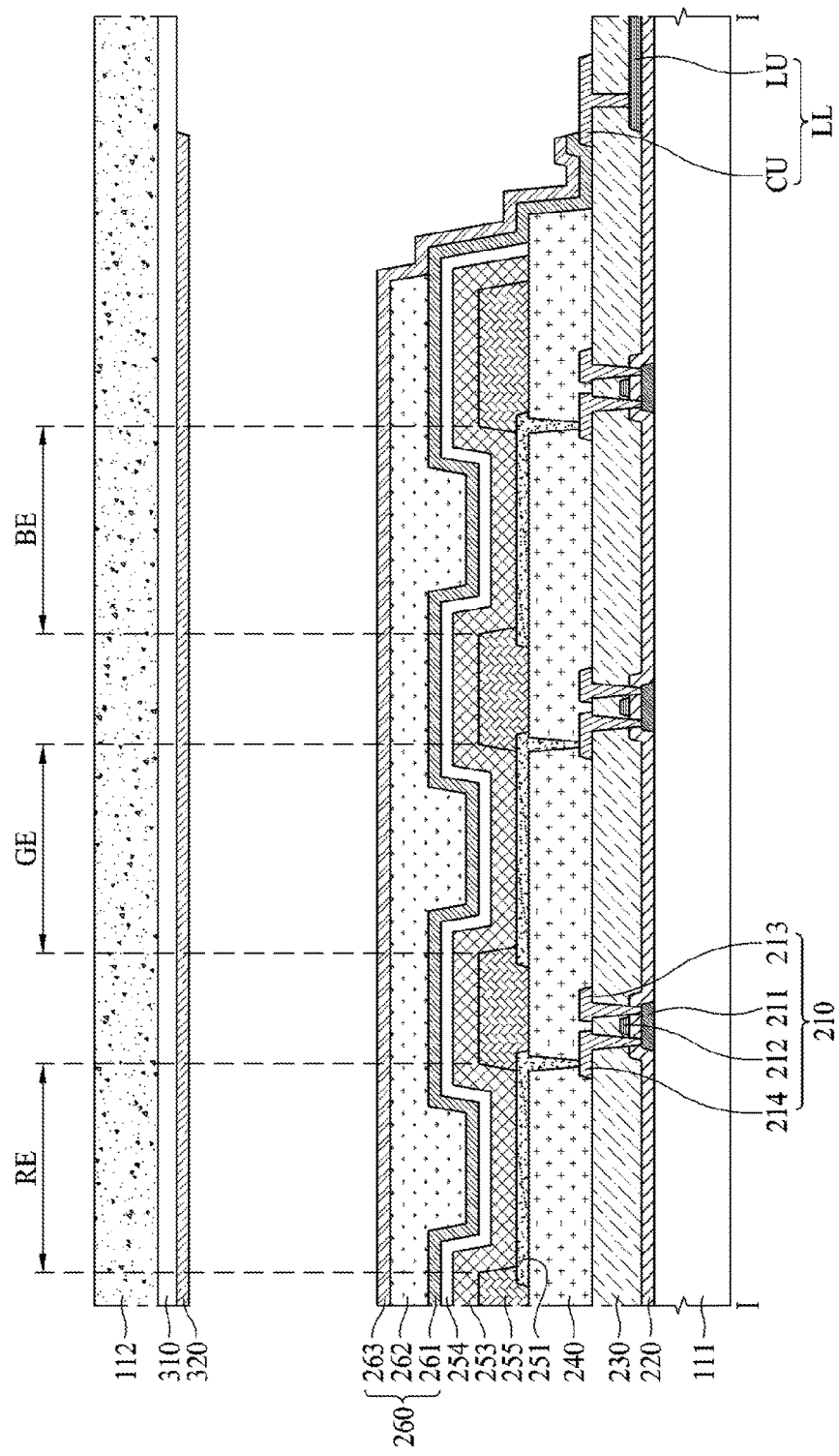

Thirdly, as shown in FIG. 8C, the hole transporting layer 320 may be provided on the first electrode 310.

The hole transporting layer 320 enables a smooth transmission of the hole from the first to third organic solar cell layers 331, 332 and 333 to the first electrode 310. The hole transporting layer 320 may be formed of TPD(N,N'-diphenyl-N,N'-bis(3-methylphenyl)-1,1'biphenyl-4,4'-diamine), or NPB(N,N'-di(naphthalen-1-yl)-N,N'-diphenyl-benzidine), but is not limited to these materials. The hole transporting layer 320 may be provided on an entire surface of the display area (DA). (S103 of FIG. 7)

Figure 8D:
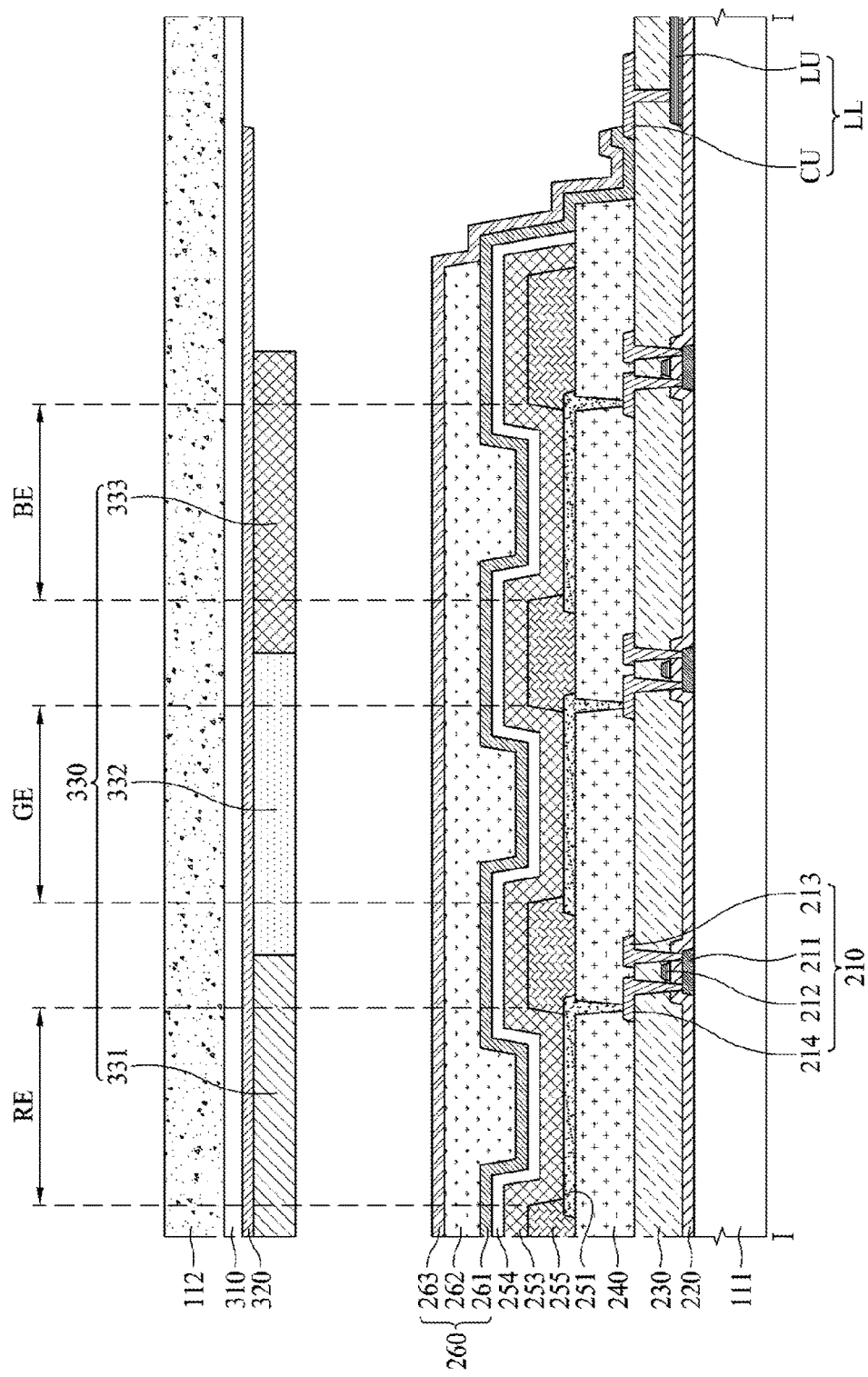

Fourthly, as shown in FIG. 8D, the first to third organic solar cell layers 331, 332 and 333 are provided on the hole transporting layer 320.

The first organic solar cell layer 331 is disposed in the red light-emitting areas (RE), the second organic solar cell layer 332 is disposed in the green light-emitting areas (GE), and the third organic solar cell layer 333 is disposed in the blue light-emitting areas (BE).

Each of the first to third organic solar cell layers 331, 332 and 333 may include the donor and acceptor materials. The donor material supplies the electron, and the acceptor material receives the electron. If the first to third organic solar cell layers 331, 332 and 333 are formed by a deposition process, the acceptor material is formed of C60. Meanwhile, if the first to third organic solar cell layers 331, 332 and 333 are formed of a solution process, the acceptor material is formed of PCBM. The donor material for each of the first to third organic solar cell layers 331, 332 and 333 may be formed of poly(para-phenylene vinylene)(PPV)-based material, derivates of polythiophene(PT), polyfluorene(PF)-based material or their copolymers, or soluble polythiophene(P3HT) of crystalline polymer. (S104 of FIG. 7)

Figure 8E:
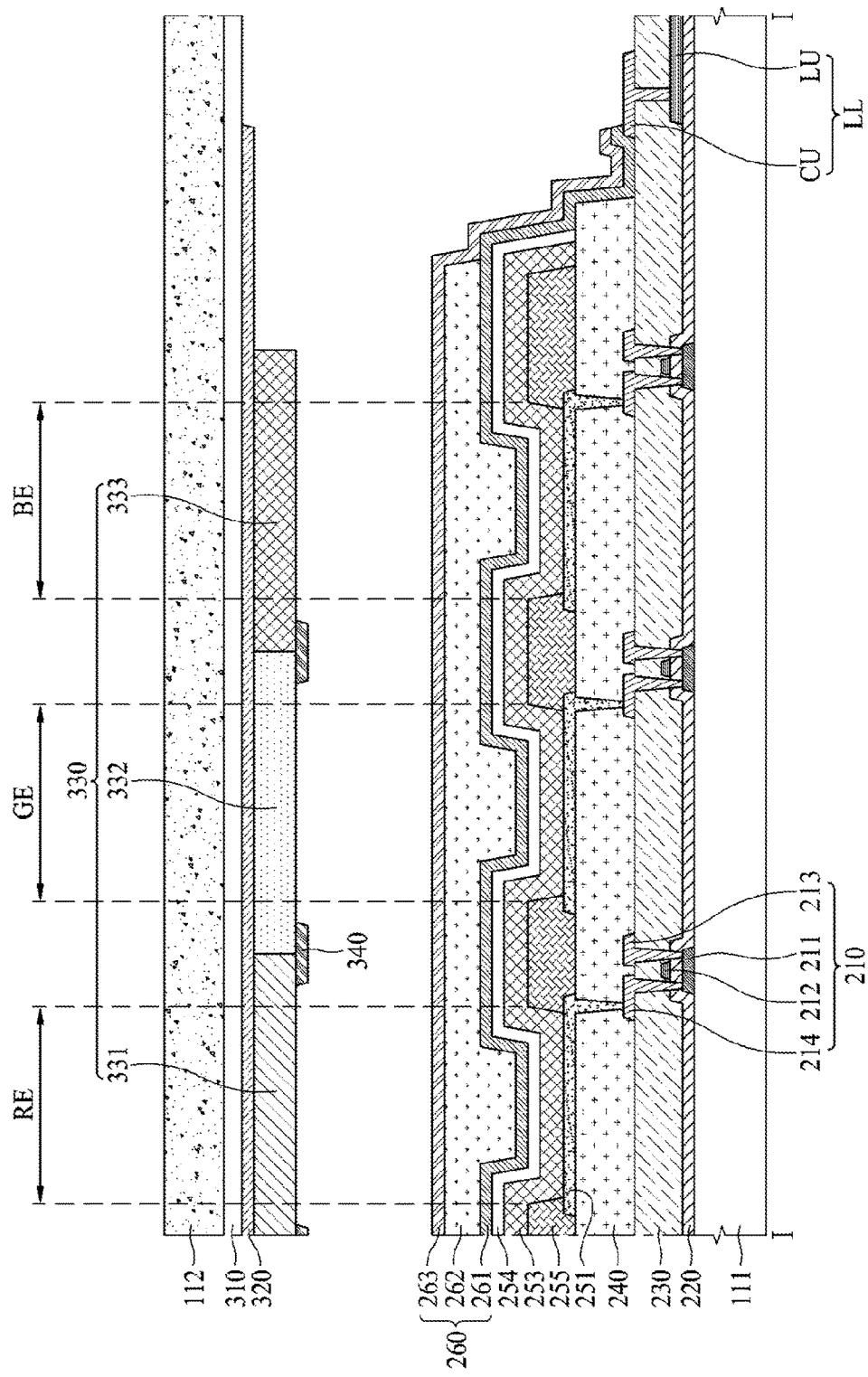

Fifthly, as shown in FIG. 8E, the black matrix 340 is provided on the first to third organic solar cell layers 331, 332 and 333.

The black matrix 340 is provided on the first to third organic solar cell layers 331, 332 and 333, and the black matrix 340 is overlapped with (e.g., overlying) the bank 255. In this case, the black matrix 340 may be provided in edges of the first to third organic solar cell layers 331, 332 and 333. The black matrix 340 includes a material capable of absorbing the light. The black matrix 340 prevents the light emitted from the neighboring light-emitting areas from being mixed together. (S105 of FIG. 7)

Figure 8F:
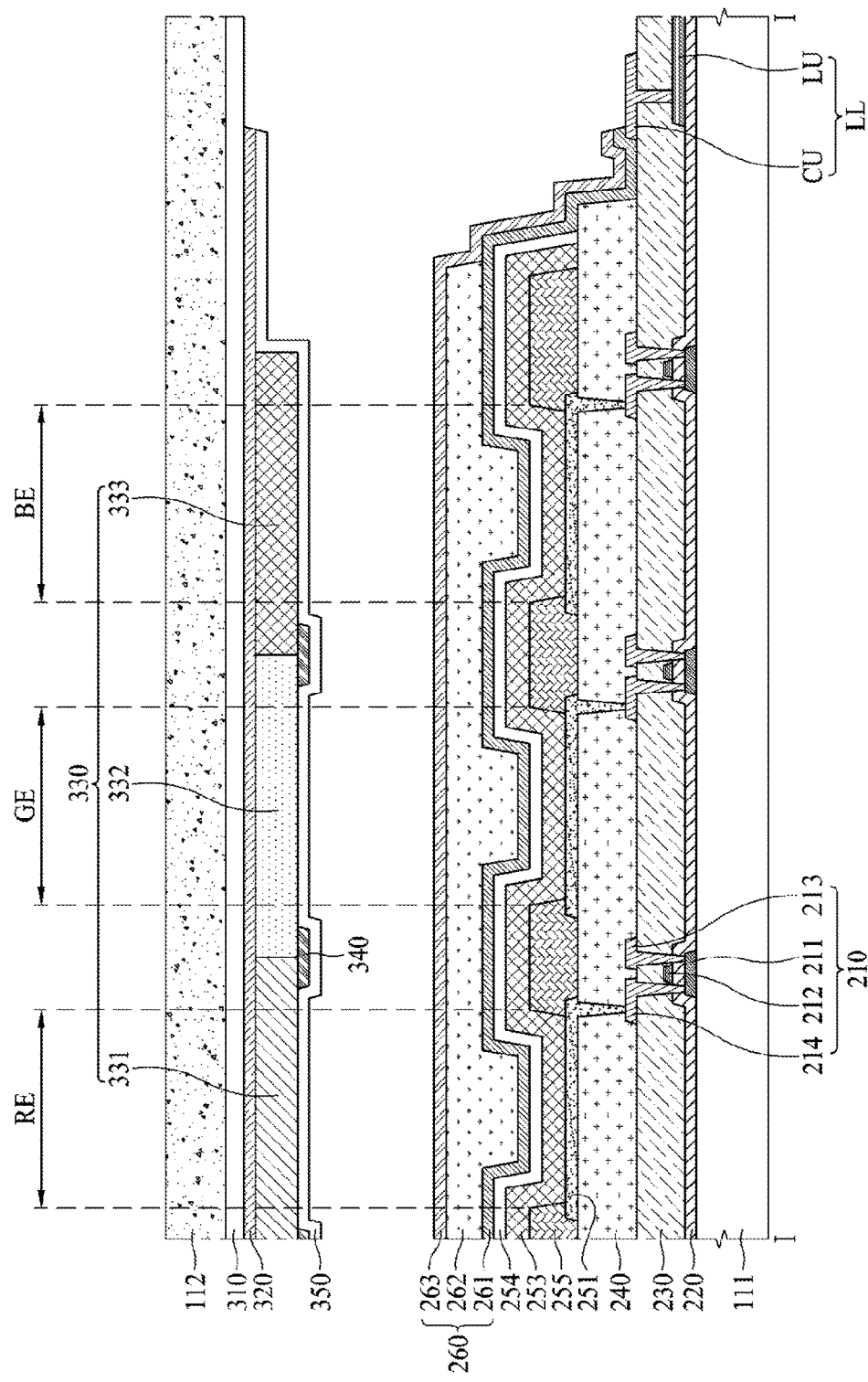

Sixthly, as shown in FIG. 8F, the electron transporting layer 350 may be provided on the first to third organic solar cell layers 331, 332 and 333 and the black matrix 340.

The electron transporting layer 350 is provided for a smooth transmission of the electron from the first to third organic solar cell layers 331, 332 and 333 to the second electrode 360. The electron transporting layer 350 may be formed of PBD(2-(4-biphenyl)-5-(4tertbutylphenyl)-1,3,4-oxadiazole), TAZ(3-(4-biphenyl)-4-phenyl-5-tertbutylphenyl-1,2,4-triazole), Liq(8-hydroxyquinolinato-lithium), BAlq(Bis(2-methyl-8-quinolinolate)-4-(phenylphenolato) aluminium), TPBi(2,2',2'-(1,3,5-benzinetriyl)-tris(1-phenyl-1-H-benzimidazole), and etc., but not limited to these materials. The electron transporting layer 350 may be provided on an entire surface of the display area (DA). (S106 of FIG. 7)

Figure 8G:
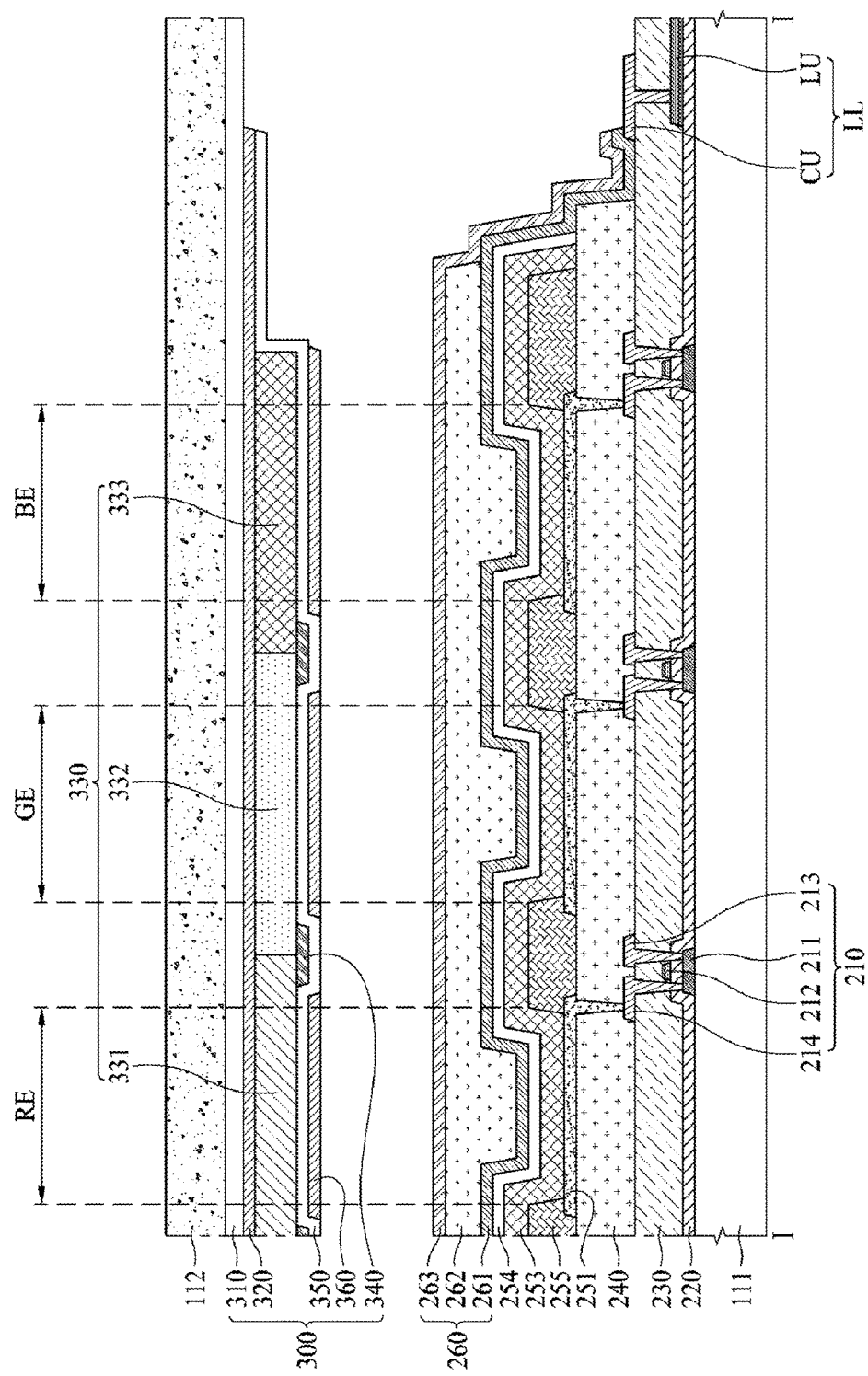

Seventhly, as shown in FIG. 8G, the second electrode 360 is patterned on the electron transporting layer 350.

The second electrode 360 is provided on the electron transporting layer 350, and the second electrode 360 is disposed corresponding to the first to third organic solar cell layers 331, 332 and 333. In this case, the second electrode 360 may be overlapped with the first to third light-emitting areas (RE, GE, BE). The second electrode 360 may be formed of a transparent metal material enabling a light transmission, for example, indium-tin-oxide (ITO) or indium-zinc-oxide (IZO), or may be formed of a semi-transparent metal material, for example, magnesium (Mg), silver (Ag), or alloy of magnesium (Mg) and silver (Ag). (S107 of FIG. 7)

Figure 8H:
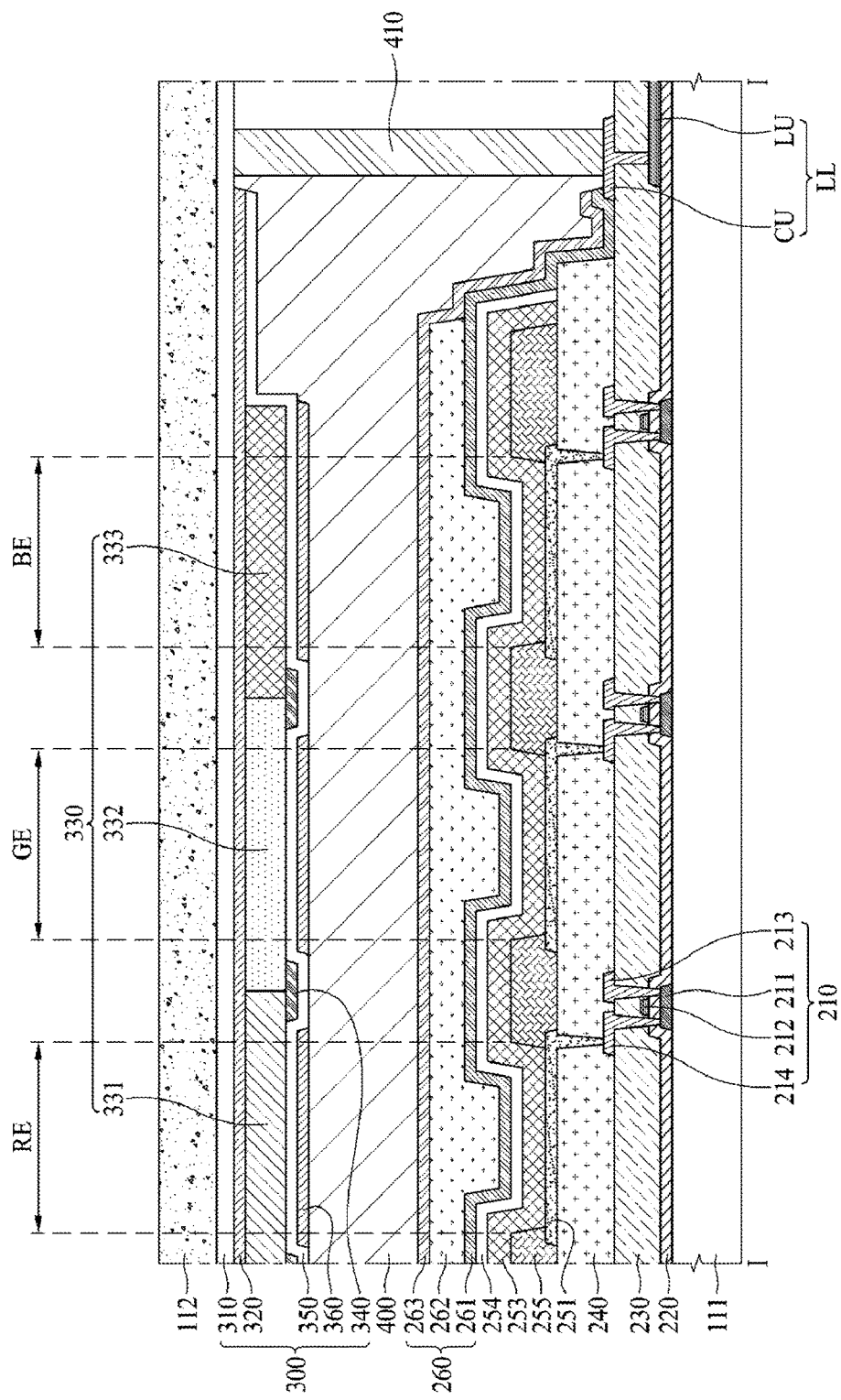

Eighthly, as shown in FIG. 8H, the lower substrate 111 and the upper substrate 112 are bonded to each other by the transparent adhesive layer 400.

The transparent adhesive layer 400 may be transparent adhesive resin. In detail, the transparent adhesive layer 400 adheres the second inorganic film 263 of the lower substrate 111 with the second electrode 360 and the electron transporting layer 350 of the upper substrate 112, to thereby bond the lower substrate 111 and the upper substrate 112 to each other.

The first electrode 310 may be connected with the link line (LL) provided in the lower substrate 111 through the conductive adhesive member 410. The conductive adhesive member 410 may be an anisotropic conductive film or anisotropic conductive paste. For convenience of explanation, FIG. 8H shows that only the first electrode 310 is connected with the link line (LL) of the lower substrate 111 through the conductive adhesive member 410. In the same manner as the first electrode 310, the second electrode 360 may be also connected with another link line of the lower substrate 111 through the conductive adhesive member 410.

By way of summation and review, the first electrode 310, the first to third organic solar cell layers 331, 332 and 333, and the second electrode 360 are provided on the upper substrate 112 of the display device according to embodiments of the present disclosure. As a result, the hole and electron produced by absorption of the solar ray in the first to third organic solar cell layers 331, 332 and 333 may be provided to the first electrode 310 and the second electrode 360, so that it is possible to charge the second battery 60. Thus, the power produced by the solar ray may be used as the auxiliary power. In one or more embodiments, the power produced by solar energy may be used to charge a primary battery, which may be a sole battery, e.g., in embodiments without a secondary or auxiliary battery.

Also, the external light is absorbed in the first to third organic solar cell layers 331, 332 and 333 of the display device according to the embodiment of the present disclosure. As a result, it is possible to prevent visibility from being lowered by the reflection of external light in the top emission method. Also, there is no need to attach a polarizing plate, which is provided to reduce the reflection of external light, to the upper substrate 112.

Also, the first to third organic solar cell layers 331, 332 and 333 are disposed to areas corresponding to the first to third light-emitting areas (RE, GE, BE), and the respective first to third organic solar cell layers 331, 332 and 333 have different light-absorbing wavelength ranges and light-transmitting wavelength ranges. As a result, the first to third organic solar cell layers 331, 332 and 333 serve as the color filters.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display device comprising:
a first light-emitting area provided on a lower substrate;
a second light-emitting area provided on the lower substrate;
a third light-emitting area provided on the lower substrate;
a solar cell layer provided on an upper substrate facing the lower substrate, the solar cell layer producing power by absorbing light, the solar cell layer including first, second and third organic solar cell layers which are disposed in areas corresponding to the respective first, second and third light-emitting areas,
wherein the solar cell layer includes:
a first electrode provided on the upper substrate;
a hole transporting layer provided between the first electrode and each of the first, second and third organic solar cell layers,
an electron transporting layer provided the first, second and third organic solar cell layers, and
a second electrode provided on the electron transporting layer and disposed in areas corresponding to the respective first, second and third organic solar cell layers.

2. The display device according to claim 1, wherein the first, second and third organic solar cell layers have different light-absorbing wavelength ranges.

3. The display device according to claim 1, wherein the first, second and third organic solar cell layers have different light-transmitting wavelength ranges.

4. The display device according to claim 1, further comprising a black matrix provided on the first, second and third organic solar cell layers and disposed on edge regions of the first, second and third organic solar cell layers.

5. The display device according to claim 1, wherein each of the first and second electrodes is electrically coupled to a respective link line provided on the lower substrate through a conductive adhesive member.

6. The display device according to claim 1, wherein each of the first, second and third light-emitting areas includes an organic light emitting device,
wherein the organic light emitting device includes:
an anode electrode;
an organic light emitting layer provided on the anode electrode; and
a cathode electrode provided on the organic light emitting layer.

7. The display device according to claim 6, further comprising:
an encapsulation layer covering the cathode electrode; and
an adhesive layer provided between the encapsulation layer and the solar cell layer.

8. The device of claim 1 further comprising:
a first battery configured to supply a first power voltage to a first power voltage line,
a second battery configured to supply a second power voltage to a second power voltage line and being charged with a charging current of the solar cell layer.

9. A device, comprising:
a first light-emitting region on a first substrate;
a solar cell layer overlying the first light-emitting region, the solar cell layer including:
an electron transport layer;
a hole transport layer; and
a first organic solar cell layer between the electron transport layer and the hole transport layer; and
a second substrate on the solar cell layer.

10. The device of claim 9, further comprising:
a second light-emitting region on the first substrate, the second light-emitting region being adjacent to the first light-emitting region;
a third light-emitting region on the first substrate, the third light-emitting region being adjacent to the second light-emitting region,
wherein the solar cell layer further includes:
a second organic solar cell layer between the electron transport layer and the hole transport layer, the second organic solar cell layer overlying the second light-emitting region; and
a third organic solar cell layer between the electron transport layer and the hole transport layer, the third organic solar cell layer overlying the third light-emitting region.

11. The device of claim 10, wherein each of the first, second and third organic solar cell layers have different light absorption and light transmissivity characteristics.

12. The device of claim 10, wherein the first organic solar cell layer includes a red color filter, the second organic solar cell layer includes a green color filter and the third organic solar cell layer includes a blue color filter.

13. The device of claim 10, further comprising:
a black matrix formed on abutting edge regions of the first and second organic solar cell layers, and the second and third organic solar cell layers;
a first electrode on the hole transport layer; and
a second electrode underlying and abutting the electron transport layer.

14. The device of claim 13, further comprising:
a transparent adhesive material between the first, second and third light-emitting regions and the second electrode.

15. The device of claim 14, further comprising:
a first conductive member formed through the transparent adhesive and coupled to the first electrode;
a second conductive member formed through the transparent adhesive and coupled to the second electrode; and
a battery coupled to the first and second electrodes via the first and second conductive members, respectively.

* * * * *